United States Patent [19]

McAllise

[11] Patent Number: 4,558,310
[45] Date of Patent: Dec. 10, 1985

[54] CURRENT SENSING DEVICE AND MONITOR

[76] Inventor: Raymond J. McAllise, 1812 Bruce St., Canal Fulton, Ohio 44614

[21] Appl. No.: 427,116

[22] Filed: Sep. 29, 1982

[51] Int. Cl.$^4$ .............................................. G08B 21/00
[52] U.S. Cl. ..................... 340/661; 324/127; 324/133; 340/662; 340/663; 340/664; 361/31; 361/94
[58] Field of Search ............... 340/660, 661, 662, 664; 324/103 R, 133, 127, 117 R; 361/31, 93, 94

[56] References Cited

U.S. PATENT DOCUMENTS

| | | | |
|---|---|---|---|
| 3,462,756 | 8/1969 | Mills | 340/288 X |
| 3,624,504 | 11/1971 | Joly | 324/127 X |
| 3,654,515 | 4/1972 | Kato et al. | 340/664 X |
| 4,037,155 | 7/1977 | Ahmed | 324/133 |
| 4,240,072 | 12/1980 | Fowler | 361/31 X |
| 4,286,213 | 8/1981 | Fowler | 324/127 |
| 4,286,751 | 9/1981 | Fowler | 361/94 X |
| 4,328,482 | 5/1982 | Belcher et al. | 340/825.57 X |
| 4,454,557 | 6/1984 | Hurley | 324/127 X |

Primary Examiner—Charles A. Ruehl
Assistant Examiner—Daniel Myer
Attorney, Agent, or Firm—McCormick, Paulding & Huber

[57] ABSTRACT

A system senses alternating current in a conductor, such as a main line supplying electrical power to a home, and responds to the sensed current as by providing a warning signal when the sensed current exceeds or is less than a preset value for a predetermined short period of time. The current sensor itself is a simple coil of wire, either with an air core or a partial ferromagnetic core, which can be easily operatively associated with the current carrying conductor without the need for disconnecting the conductor from its terminals and which when installed does not present the hazards associated with current transformers.

14 Claims, 16 Drawing Figures

CURRENT SENSING DEVICE AND MONITOR

BACKGROUND OF THE INVENTION

This invention relates to a device for sensing the amount of alternating current flowing through a conductor or set of conductors to an electrical load and to a related monitor for turning on a warning, indicating, control or some other device if the current level exceeds or drops below a preset value for longer than a specified period of time.

The sensing device and monitor of this invention can have numerous applications, one of which is to sense the amount of current consumed by an electrical utility customer, particularly a customer who is charged by the utility in accordance with the peak power consumption experienced by the consumer during a given billing period. The device of the invention can be used by such a customer to warn him if the current level of the electrical power supplied to his house or other building has exceeded a certain peak demand level thereby allowing him to shut off certain appliances or other power consuming devices to bring the current level below the peak demand level before the peak demand level is exceeded for a sufficient period of time as to incur a higher billing charge. Of course, the invention can be used in any other application wherein it is desirable to provide a warning or indication when the current flowing through an electrical conductor or set of conductors exceeds or drops below a preset value for a preset amount of time.

An object of the invention is to provide a current sensing device and monitor which is relatively simple and of low cost construction so as to be easily affordable to general utility customers as well as to other users.

Another object of the invention is to provide a current sensing device which is of simple low-cost construction and which may be used in conjunction with a current carrying conductor or conductors without the need for disconnecting the conductor or conductors, thereby allowing the sensor to be operatively associated with the conductor or conductors with great ease.

Furthermore, an object is to provide such a current sensor which does not surround the conductor or conductors and which avoids the hazards of common current transformers.

Another object of the invention is to provide a current sensing device and monitor which may be packaged as a small unit readily capable of being housed in or near the electrical circuit breaker or fuse box of the usual home, and which monitor may include provision for a remote alarm whereby the alarm may consist of an electrically operated visual, audible or control device plugged into any selected branch circuit of the home.

Other objects and advantages of the invention will be apparent from the following description and from the appended drawings forming a part hereof.

SUMMARY OF THE INVENTION

The invention resides in a simple device for sensing the current flowing through an electrical conductor or set of conductors and an associated monitor for supplying an indication or warning when the current in the conductor or conductors exceeds or drops below a preset value for a given amount of time.

More particularly, the invention resides in the current sensing device being a simple coil of wire, either with an air core or a simple ferromagnetic core, adapted to be placed adjacent to an alternating current carrying conductor or set of conductors with its coil axis located in a plane perpendicular to or in the proximity of the axis of the current carrying conductor or conductors so that the lines of flux encircling the conductor or conductors pass through the coil and induce a voltage therein.

Further, the invention resides in the current sensing device being a simple coil as described above usable with one, two or possibly more current carrying conductors and operable to produce an output voltage proportional to the combined current traveling in the conductors. If the current in two wires are traveling in the opposite direction the coil will have an additive effect so that its output voltage is related to the sum of the two currents. If the currents are traveling in the same direction the coil will have a subtractive effect so that its output voltage will be related to the difference between the two currents.

The invention also more particularly resides in the monitor including a sensing comparator for comparing the voltage induced in the sensing coil with a preset voltage and for producing an output signal when the sensing coil voltage is greater (or in some cases less than) than the preset voltage, a duration detector for detecting the fact that the output signal of the sensing comparator has persisted for a given amount of time, and a response means for responding to an output from the duration detector. The response means further may consist of an indicator, control or warning device directly responsive to an output signal from the duration detector, or it may consist of such an indicator or warning device connected to the duration detector through an oscillator which provides a pulsating signal to the indicator or warning device to produce an ON-OFF or flashing type of warning signal. However, an indicating means may be connected directly to the coil or sensing comparator with the duration detector and the oscillator being omitted. Also, the oscillator may drive a switching device which in turn actuates a remote alarm through a selected one of the branch circuits of the home or building so that the remote alarm may be plugged into one of the electrical outlets of such branch circuit.

DETAILED DESCRIPTION OF THE PREFERRED EMBODIMENTS

Figure 1:
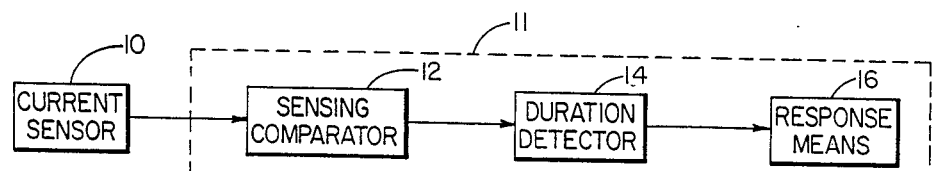
FIG. 1 is a block diagram showing the general construction of a system embodying the invention.

FIG. 1 shows in block diagram form a system embodying this invention and comprising a current sensor 10, and an associated monitor 11 comprised in turn of a sensing comparator 12, a duration detector 14 and a response means 16. Although the current sensor 10 is preferably a simple coil sensor described hereinafter in connection with FIGS. 4 to 6 and 11-12, it broadly may consist of any type of sensor which when associated with an alternating current carrying conductor produces a voltage signal having a magnitude directly related to the magnitude of the current flowing in the conductor.

The sensing comparator 12 compares the output of the sensor 10 with a given preset voltage level and produces an output when the sensor output voltage exceeds such preset level. This output of the sensing comparator 12 is in turn transmitted to the duration detector 14 which measures or detects whether the output of the sensing comparator has persisted for a given length of time and when such detection is made an output is transmitted to the response means 16. The response means 16 is in turn, within the broader scope of the invention, any type of suitable means for responding to the duration detector output and may, for example, be a visual or audible indicator, alarm or other warning device for providing a warning to a person or persons located in the vicinity of the device or may be a more complex device having means for automatically turning off various appliances or other electrical loads, preferably in a predetermined sequence, as necessary to return the current in the conductor to a value below the preset value established by the sensing comparator 12, at which time the response means becomes deactivated.

Figure 2:
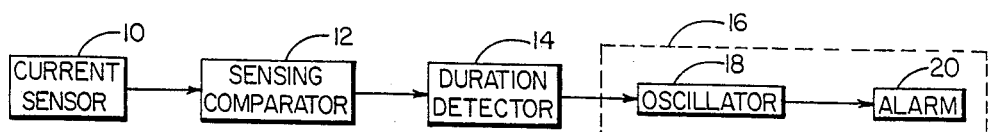
FIG. 2 is a block diagram showing in further detail a system according to FIG. 1.

FIG. 2 is similar to FIG. 1 except it in more detail shows the response means 16 of FIG. 1 as comprising an oscillator 18 and an alarm 20. The alarm 20 can be audio, visual or both. The purpose of the oscillator 18 is to pulsate the alarm 20 to make its output more noticeable to human senses. The oscillator 18 need not, however, be present if the pulsating feature is not wanted, and in this case the alarm 20 may be connected directly to the duration detector 14 without the intervening oscillator 18. In the case of an electric utility customer, the entire system shown in FIG. 2 may be made as a small package located in or near the fuse box, circuit breaker box, or at another point where the incoming electrical lines to the associated building are physically accessible.

Figure 3:
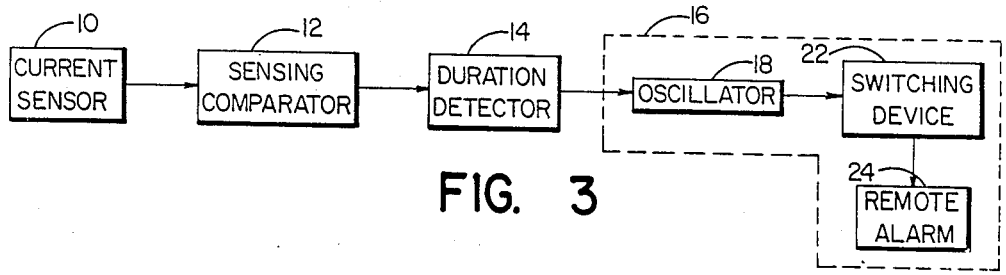
FIG. 3 is a block diagram showing another system according to FIG. 1.

FIG. 3 shows a system according to FIG. 1 wherein the response means 16 of FIG. 1 constitutes an oscillator 18, a switching device 22 and a remote alarm 24. As explained in more detail hereinafter, the switching device 22 cooperates with a selected branch circuit, and the remote alarm 24 is plugged into one of the outlets of that branch circuit, so that the alarm can be positioned at any desired location within the building. In particular, the output of the oscillator 18 operates the switching device 22, which is a normally closed switch and may, for example, be either a relay or a thyristor with each pulse of the oscillator signal operating the switching device so that the associated branch circuit is opened for only a very brief instant of time which is not distinguishable to most electrical loads that may be connected to the branch circuit. The remote alarm 24 is a device which will respond to the brief interruption of the power to it and which will upon being so triggered alert the utility customer that the current demand has gone too high and that at least one electrical load should be removed from operation.

The advantage of the alarm being merely an audio or visual one is that in response to it a utility customer can choose which electrical load he wishes to shut off at any particular time, as priority levels for people do not always remain the same. However, as mentioned, by use of more complex circuitry the response means can operate to automatically turn off loads in a preprogrammed manner.

Figure 4:
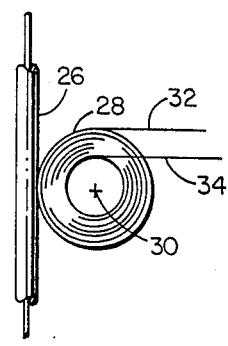
FIG. 4 is an elevational view showing a sensing device embodying one feature of the invention.

FIG. 4 shows a preferred form of current sensor used in a system according to this invention and embodying the sensor 10 of FIGS. 1, 2 and 3. In FIG. 4 the current carrying conductor is indicated at 26 and may be one of the main lines supplying power to a home. The sensor in turn consists of a coil 28 of wire wound about a central axis 30 and having two output leads 32 and 34. The coil 28 is an air-core coil and is shown as consisting of nothing more than the coiled wire itself which may be held together by suitable adhesive or potting material, but the coil could also, if desired, have a suitable core or bobbin of cardboard, plastic or the like. In use, the coil 28 is placed tangent to the conductor 26, as shown in FIG. 4, so that its axis 30 is located in a plane perpendicular to the conductor 26. Therefore, some of the lines of flux encircling the conductor 26 pass through the coil 26, and as this flux varies, due to the current in the conductor 26 being an alternating current, the accompanying changing flux through the coil 28 causes an alternating voltage to be induced in the coil which appears across the output leads 32 and 34, with such output voltage having a peak value or magnitude related to the value or magnitude of the current flowing in the conductor 26.

Figure 5:
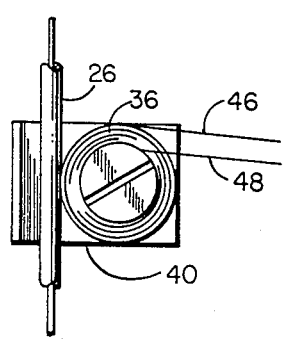
FIG. 5 is an elevational view showing another form of sensing device embodying a feature of the invention.
Figure 6:
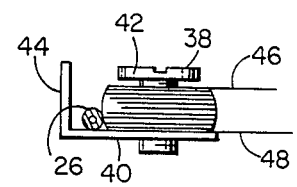
FIG. 6 is a side view of the sensing device of FIG. 5.

Instead of the sensing coil as shown in FIG. 4 being one having an air core, it may also be one having a simple ferromagnetic core, such as shown in FIGS. 5 and 6, having an air gap adapted to allow the sensing coil to be readily associated with the conductor 26 and reducing the reluctance of the flux path through the sensing coil. Referring to FIGS. 5 and 6, the illustrated sensing coil is indicated at 36 and is similar to the coil 28 of FIG. 4 except for being received on a ferromagnetic screw 38 threaded into an L-shaped ferromagnetic part 40. The head 42 of the screw 38 can be relatively large, as shown, so as to be located relatively close to the leg 44 of the part 40, but leaving sufficient gap to allow the unit to be assembled with the conductor 26 without the conductor 26 having to be disconnected. The output leads for the coil 36 are shown at 46 and 48.

Figure 7:
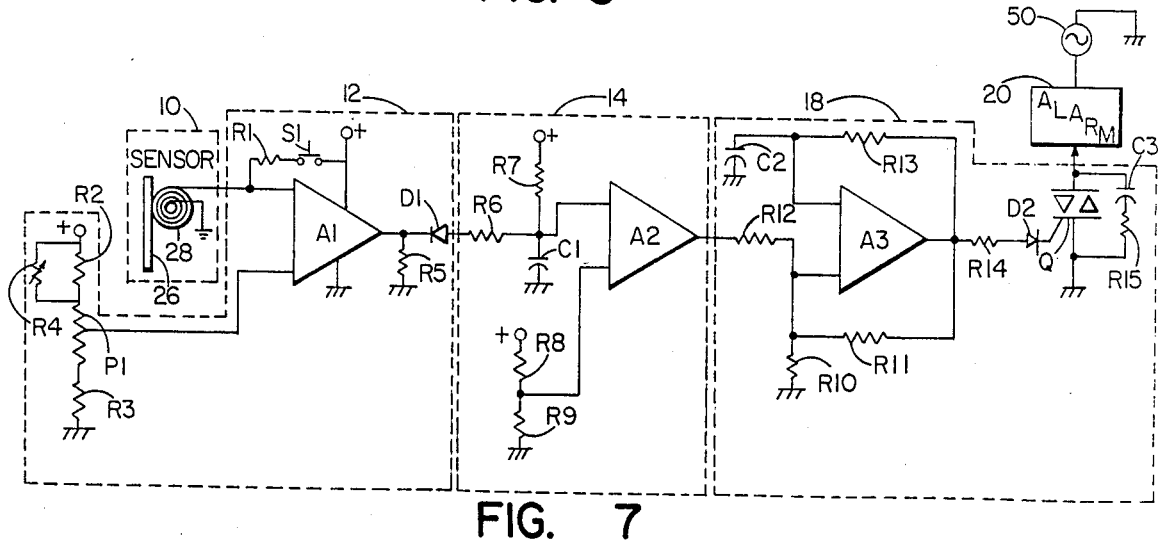
FIG. 7 is a schematic diagram showing in more detail a current sensing device and monitor embodying the invention.

FIG. 7 shows the actual circuit diagram for a system embodying the invention and similar to that shown more generally in FIG. 2. The components of FIG. 2 are shown by broken lines in FIG. 7, except for the alarm 20. The current sensor 10 is in the form of an air core coil such as that shown at 28 in FIG. 4. The output voltage from this coil 28 is fed into an operational amplifier or voltage comparator A1 included in the sensing comparator 12 and is there compared with a preset voltage the level of which is set by resistors R2, R3 and R4 and potentiometer P1. The variable resistor R4 can be used to internally calibrate the unit in order to set the amount of effect that the potentiometer P1 will have on the sensing levels. A switch S1 in series with a resistor R1 is used to force the voltage from the sensor to a value above the preset level for the purpose of testing all of the circuitry subsequent to the output of the sensing comparator 12. If the sensing comparator 12 detects a voltage above the value preset by the potentiometer P1 in combination with the resistors R2, R3 and R4, then the voltage of the amplifier A1 will go low and the capacitor C1, in the duration detector 14, will primarily discharge through the amplifier A1 and the resistors R6 and R5. When the capacitor C1 is discharged to a voltage level set by the resistor R8 and the resistor R9 then the output of the operational amplifier A2 will be forced high. A time delay period between when the output of amplifier A1 goes low and when the output of the amplifier A2 goes high is determined by the values of the capacitor C1 and of the resistors R5, R6, R7, R8 and R9.

When the output of the operational amplifier A2 goes high the oscillator 18, centered around the operational amplifier A3, will produce a series of voltage pulses for as long as the sensed current level is above the preset value. The duty cycle of the oscillator can be varied by changing the values of the capacitor C2 and of the resistors R11 and R13. The oscillating output of the amplifier A3 then triggers a switching device Q to activate the alarm 20 which is connected to the AC source indicated at 50. The illustrated switching device Q is shown as a triac, but in reality it could also be an optocoupler, an SCR, a relay, a transistor, or another electrically activated switch. The diode D2 is present to protect the circuitry from reverse AC voltages which can trigger the triac. The resistor R15 and capacitor C3 constitute a snubbing circuit to protect the triac from excessive dv/dt values. Although the alarm is shown to be operated from the AC source 50, with modifications it can also be made to operate on a DC voltage supply. Also, if desired, the resistor R9 of the duration detector 14 could be replaced with a potentiometer so as to allow for adjustment of the period of time delay between the time the excessive current is sensed and the time the alarm is activated.

Figure 8:
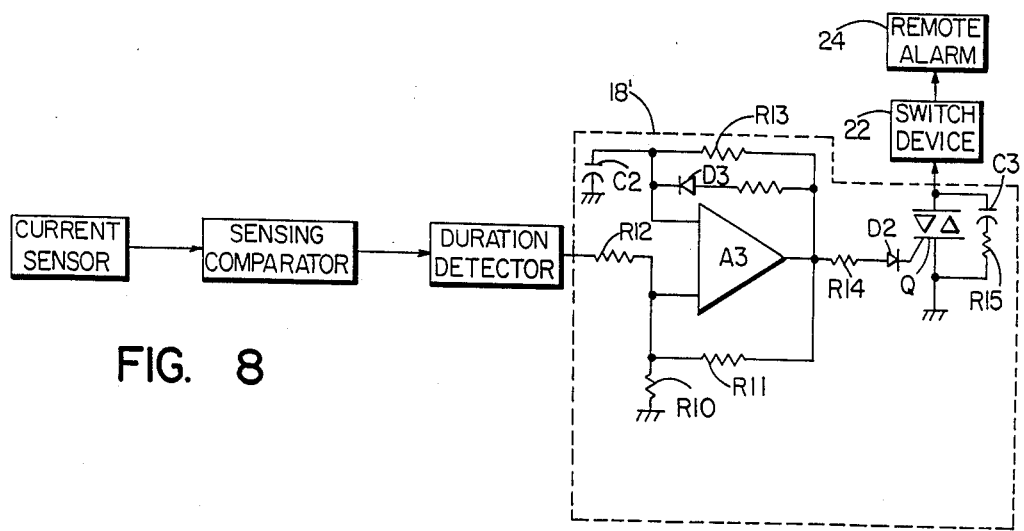
FIG. 8 is a diagram partly in block and partly in schematic form showing an oscillator with an unequal duty time.

FIG. 8 shows a system according to FIG. 3 in which the current sensor 10, the sensing comparator 12 and the duration detector 14 are or may be similar to such units as shown in detail in FIG. 7. The oscillator 18' of FIG. 8, however, differs from that of FIG. 7 in that it has an unequal duty time. Such an unequal duty time is required because of the system including a remote alarm device 24 connected to a branch circuit of the house wiring and because of the presence of a switching device 22 which operates in response to an output signal from the oscillator 18' to very briefly interrupt or open the branch circuit, with the period of interruption or opening of the circuit being sufficiently brief, such as a fraction of a second, to operate the remote alarm while not significantly hampering the operation of other loads connected to the branch circuit, all as explained in more detail hereinafter. In particular, in the oscillator 18' of FIG. 8 the circuitry is the same as that of the corresponding oscillator 18 of FIG. 7 except for the resistor R16 and diode D3 being connected in parallel with the resistor R13.

Figure 9:
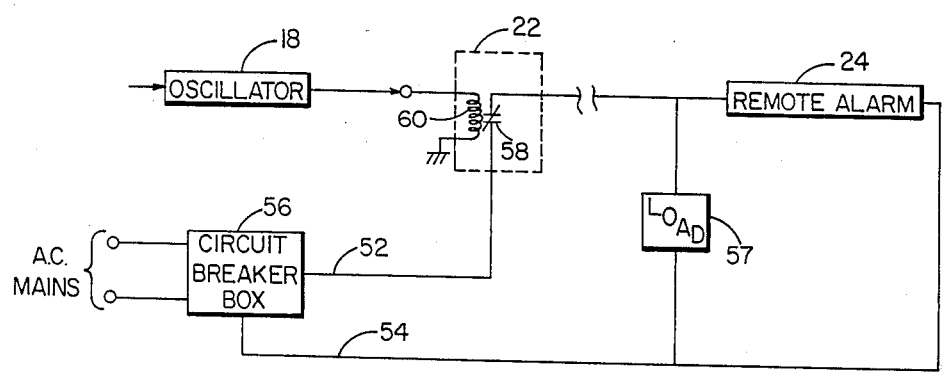
FIG. 9 is a block diagram showing in general the way a remote alarm is connected to the oscillator.

FIG. 9 shows in block diagram form the general connection of the remote alarm 24. The branch circuit in which the remote alarm 24 is connected is represented by the lines 52 and 54 issuing from the illustrated circuit breaker box 56 and to which other conventional appliances are or may be connected as represented by the load 57. The remote alarm preferably is one which is attached to the branch circuit by means of a plug inserted into a wall outlet, or other outlet provided in the branch circuit. Therefore, in a normal house or building wiring scheme, the remote alarm 24 can be located at almost any location in the house or building by associating the switch device 22 with the proper branch circuit and by plugging the remote alarm 24 into the desired outlet.

The switching device 22 of FIG. 9 may take various different forms but is shown to constitute a relay having a set of normally closed contacts 58 connected in series with the branch circuit and an operating coil 60. Each time a short duration output pulse is produced by the oscillator 18 the coil 60 is energized to open the contacts 58 with the opening being of sufficient time duration to actuate the remote alarm 24 while likewise being sufficiently brief as to not hamper normal operation of the appliances or other devices making up the load 57.

Figure 10:
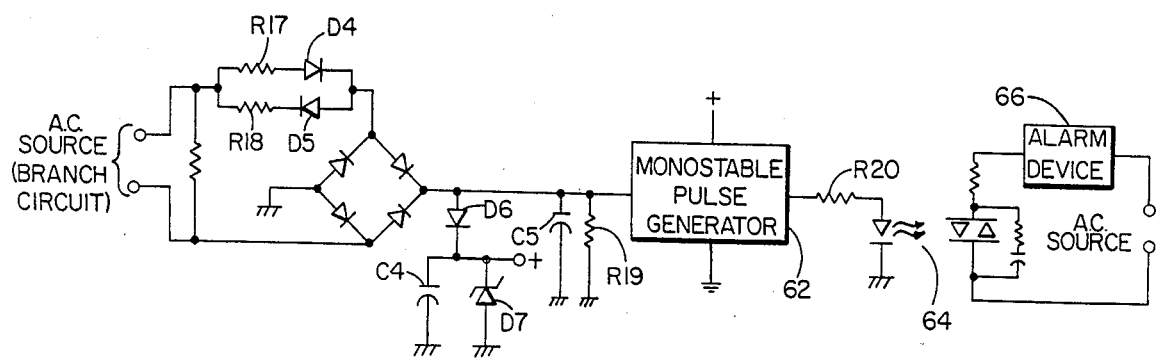
FIG. 10 is a schematic diagram of the remote alarm of FIG. 9.

FIG. 10 shows the actual circuit diagram of the remote alarm 24 of FIG. 9. This remote alarm is based on the fact that the capacitor C5 has a value much less than that of the capacitor C4 for the purpose of reacting to transient reductions in voltage. When the voltage from the AC source is instantaneously interrupted, the capacitor C5 discharges through the resistor R19 and produces an input pulse to the monostable pulse generator 62. This pulse generator then outputs a positive pulse of a previously selected duration through the LED of the illustrated optocoupler 64. This optocoupler then activates the alarm device 66 which is in series with it. The optocoupler could also be another type of electrical device such as a relay, thyristor, transistor or transformer. Again, this remote sensing circuit can activate any type of alarm device or other electrical control. The diode D6 keeps the capacitor C4 from discharging into the capacitor C5 thereby inhibiting the capacitor C5's ability to discharge fully. DC power to the pulse generator 62 is not lost because of the extremely long time constant of the capacitor C4 as opposed to that of the capacitor C5.

In the above description the monitor 11 has been described as one which functions to give a warning, indication or some other response if the current in an associated conductor or set of conductors exceeds a preset value, the monitor usually functioning to provide such warning, indication or other response only in the event the sensed current exceeds a preset value for a predetermined amount of time. Such type of operation is perhaps the more usually desired one and, as mentioned above, lends itself to many applications as for example the one of providing a warning, indication or other response when the current to a house or building exceeds a certain level calling for an additional fee charge from the utility company supplying the power. However, there may be other applications in which it is desirable that the monitor function to provide a warning, indication or other response in the event the current in a conductor or set of conductors falls below a preset value—preferably with such warning, indication or other response again being given only if the current falls below such preset value for a predetermined amount of time. Such functioning of the monitor is within the scope of the present invention and a monitor having such a function may be readily obtained by, for example in connection with FIG. 7, using as the operational amplifier or comparator A1 which goes low when the voltage supplied by the sensor 28 falls below the set value of voltage provided by the resistors R2, R3, R4 and P1.

Also, FIGS. 4, 5, 6 and 7 all show the current sensor 28 or 36 used in association with a single current carrying conductor 26 and operating to sense only the current flowing in that one conductor. A further feature of the invention is, however, that such a sensor, consisting basically of a coil of wire, can also be used to sense the current flowing through two or more wires arranged tangentially to it. The sensing coil has an additive or subtractive effect depending on the relative orientations of the wires and the directions in which currents flow through them. For instance, two parallel wires may be arranged tangentially along opposite sides of the coil. The output voltage signal of the coil will then be directly proportional to the combined currents traveling in the two wires. If the currents in the two wires are traveling in the same direction, the sensing coil will have a subtractive effect—that is, the output voltage of the coil will be proportional to the difference between the two currents flowing in the two wires. Likewise, if the currents are traveling the opposite directions the coil will have an additive effect—that is, the output voltage of the coil will be proportional to the sum of the two currents flowing in the two wires.

Figure 11:
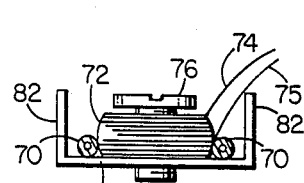
FIG. 11 is a side view of another sensing device according to the invention.
Figure 12:
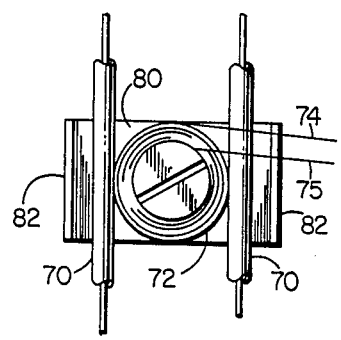
FIG. 12 is a plan view of the sensing device of FIG. 11.

FIGS. 11 and 12 show a current sensor embodying this invention and used for sensing the current in two parallel conductors 70, 70 which may, for example, be the two "hot" lines or mains of the type typically used to supply homes or small buildings with single phase electrical power and which conventionally have an approximately 240 volt difference across themselves and are used in conjunction with a third ground line, each of the conductors 70, 70 having an approximately 120 volt difference between itself and the ground line.

The sensor of FIGS. 11 and 12 employs a sensing coil 72 with output leads 74, 75 which is received on a ferromagnetic screw 76 threaded into a ferromagnetic part 78 shaped as shown in FIG. 11 with a flat base 80 and two sidewalls 82, 82, each sidewall 82 being spaced from the outer circumference of the coil 72 a sufficient amount to form a recess for receiving an associated one of the conductors 70.

In an electrical power supply system for a home or a small building as described above, the conductors 70, 70 have current flowing through them in opposite directions and therefore the coil 72 has an additive effect so as to produce an output voltage across its output leads 74 and 75 which is directly related to the sum of the currents flowing in the two conductors 70, 70. It will of course be understood that the current sensor of FIGS. 11 and 12 may be used as the current sensor 10 of FIGS. 1, 2, 3, 7 and 8 in which case the associated monitor 11 responds to the total value of the current in the two conductors 70, 70. It will also be understood that for sensing the current flowing in two wires the particular arrangement of FIGS. 11 and 12 is not necessary and that other devices may be used for holding two conductors adjacent the outer circumference of a sensing coil, preferably with the two conductors parallel to one another and on opposite sides of the coil, as in FIGS. 11 and 12 and with both conductors located in a common plane perpendicular to the coil axis. Also, the coil may be an air core one if desired.

In particular, a two wire sensing unit, such as shown in FIGS. 11 and 12, may be placed between the two incoming power lines to the fuse or circuit breaker box in a house or small building supplied with single phase power. If the sensing unit is then associated with a monitor 11, as described above, the current monitor is the total current traveling in the two power lines at any one time. If such total current in the two wires exceeds a preset value the monitor them operates, as above described, to provide a suitable warning, indication or other response. Also, although the sensing coil 72 is shown to be circular this shape is not critical and if desired the coil may be wound with an oval or rectangular shape or any other shape suiting the conditions with which it is to be used. The same is also true for a sensing coil used with a single wire as in FIGS. 4, 5 and 6.

Figure 13:
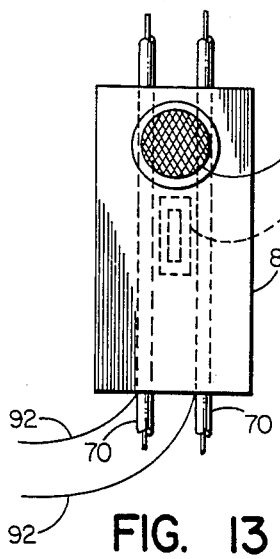
FIG. 13 is a front view of a combined sensor and monitor unit embodying the invention.
Figure 14:
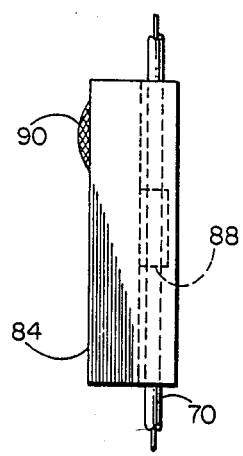
FIG. 14 is a side view of the unit of FIG. 13.
Figure 15:
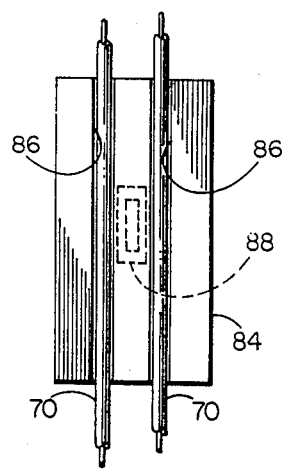
FIG. 15 is a rear view of the unit of FIG. 13.

The sensing coil in either a single conductor or two conductor sensing system may be located in a housing which also contains all or most of the components of the associated monitor. Such arrangement for a two conductor sensing system is shown in FIGS. 13, 14 and 15. In this case the housing is indicated at 84 and on its rear surface it has two longitudinal recesses 86, 86 which receive the two conductors and thereby bring into proper association with the conductors a sensing coil 88 of rectangular shape contained within the housing 84. All of the remaining components of the monitor are included in the housing 84, including an audible alarm 90 which sounds an alarm when the total current traveling in the two conductors 70, 70 exceeds a preset value. Of course, other types of alarms, warning devices or indicators could be used, if desired. Two lines 92, 92 provide power for the components in the housing 84 and may be connected to a standard electrical outlet or to terminals in the associated fuse or circuit breaker box.

Figure 16:
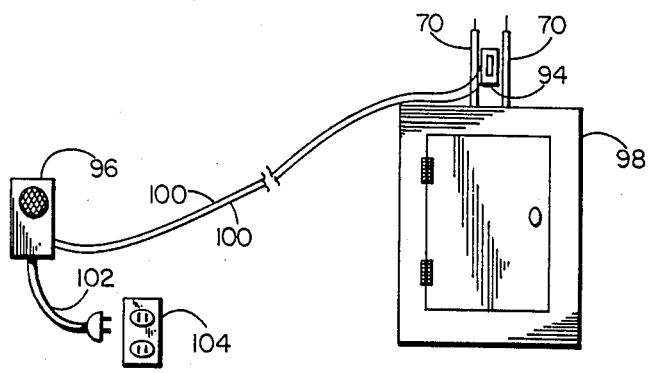
FIG. 16 is a schematic view of another current sensing and monitoring system embodying the invention.

FIG. 16 shows a system in which the sensing coil, indicated at 94, is separate from the monitor, indicated at 96, contained in its own housing. In this case the sensing coil or unit 94 may be placed between the two incoming wires to a home or building at any point at which access can be had to them, the illustrated case showing the sensing unit 94 located between the two conductors 70, 70 near the fuse or circuit breaker box 98. In some instances, the sensing unit may also be located within the circuit breaker box or fuse box if more convenient. The separate monitor 96 may be located at any convenient location within the home or building and connected to the sensing unit by conductors 100, 100. A separate two conductor line 102 connected to the monitor 96 and adapted to be plugged into a standard wall outlet 104 provides power for the components in the monitor 96.

I claim:

1. A system for sensing and responding to an alternating current flowing through an electrical conductor, said system comprising a current sensor for sensing the current in at least one conductor and for producing an output voltage related in magnitude to the magnitude of the current flowing through such at least one conductor, said current sensor being a coil of wire wound about a central axis and arranged adjacent to said conductor with said central axis spaced from said conductor and located in a plane non-parallel to said conductor so that some of the flux lines encircling said conductor link with said coil, a substantial portion of the path of said flux lines which link with said coil extending through air, the length of said portion of said flux path which passes through air being considerably longer than the diameter of said conductor so that said coil can be moved sidewise of said conductor into association with said conductor in the course of being assembled with said conductor, a sensing comparator means for comparing the output voltage of said coil with a preset value of voltage and for producing an output signal when the output voltage from said coil departs in one direction from said preset voltage, a duration detector connected with said sensing comparator and operable to produce an output signal when the output from said sensing comparator has persisted for a predetermined amount of time, and means responsive to said output of said duration detector.

2. A system according to claim 1 further characterized by said means responsive to said output of said duration detector being an alarm device directly connected with said duration detector for producing a warning signal in response to receipt of an output signal from said duration detector.

3. A system as defined in claim 1 further characterized by said means responsive to the output of said duration detector being an oscillator connected to said duration detector and responsive to the output signal from said duration detector for producing a series of output voltage pulses, and an alarm connected to said oscillator which is turned on by each of said pulses of said oscillator output so that said oscillator and alarm device in combination produce an intermittent output from said alarm device.

4. A system as defined in claim 1 further characterized by said means responsive to the output of said duration detector being an oscillator connected to said duration detector and responsive to the output signal from said duration detector for producing a train of output pulses wherein each pulse is of short duration in comparison to the duration of the time existing between successive pulses, a switching device connected with said oscillator and with a branch circuit in the wiring scheme of a building, said switching device including means for opening said branch circuit during the appearance of each of said short duration pulses from said oscillator, and a remote alarm means connected with said branch circuit and responsive to the brief interruptions of power in said branch circuit as effected by said short duration pulses to produce a warning signal.

5. A system as defined in claim 4 further characterized by said short pulses being of such short duration as to not substantially effect the operation of other electrical devices connected to said branch circuit.

6. A system as defined by any one of claims 1 to 5 wherein said current sensor is a coil of wire adapted to be placed tangentially adjacent at least one current carrying conductor with its axis in a plane perpendicular to the axis of the conductor.

7. A system as defined by any one of claims 1 to 5 wherein said current sensor is a coil of wire adapted to be placed adjacent to two parallel current carrying conductors spaced from one another with said coil of wire being located between said two conductors so that its axis is non-parallel to the plane containing said two conductors and so that said two conductors respectively pass adjacent opposite sides of said coil with at least some of the flux lines encircling each of said conductors linking with said coil, a substantial portion of the path of said flux lines of each conductor which link with said coil extending through air.

8. A system as defined by claim 7 further characterized by said coil of wire being located within a housing having at least one recess for receiving a current carrying conductor, said coil being so located relative to said housing that when a current carrying conductor is placed in said recess said coil is properly located relative to said conductor to sense the current flowing in said conductor.

9. A system as defined by claim 7 further characterized by said coil of wire being located within a housing having two spaced parallel recesses for receiving two current carrying conductors, said coil being so located relative to said housing as to be situated between said two recesses and so that when two current carrying conductors are placed in said two recesses said coil is properly located relative to said two conductors to sense the current flowing in both of said conductors.

10. A system for sensing alternating current flowing through an electrical conductor and for responding to the sensed value of current, said system comprising a coil of wire wound about a central axis and adapted to be placed adjacent at least one alternating current carrying conductor with its axis located in a plane non-parallel to the axis of the conductor so that some of the flux lines encircling said conductor link with said coil, a substantial portion of the path of said flux lines which link with said coil extending through air, the length of said portion of said flux path which passes through air being considerably longer than the diameter of said conductor so that said coil can be moved sideways of said conductor into association with said conductor in the course of being assembled with said conductor, said coil having two output leads across which an output voltage induced in said coil by the current flowing through said at least one conductor appears, and means connected with said output leads of said coil for responding to the voltage appearing across said leads.

11. A system as defined in claim 10 further characterized by said means connected across said output leads of said coil being means providing an action when said voltage across said output leads departs in one direction from a predetermined value for a predetermined duration of time.

12. A system as defined in claim 10 further characterized by said coil being one having an air core.

13. A system according to claim 10 further characterized by said coil being one having a ferromagnetic core including an air gap permitting the coil to be moved into cooperative association with a current carrying conductor without need for disconnecting the conductor.

14. A system according to claim 10 further characterized by said coil of wire being located within a housing having at least one recess for receiving a current carrying conductor, said coil being so located relative to said housing that when a current carrying conductor is placed in said recess said coil is properly located relative to said conductor to sense the current flowing in said conductor.

* * * * *